US006268109B1

(12) United States Patent
Hill

(10) Patent No.: US 6,268,109 B1
(45) Date of Patent: Jul. 31, 2001

(54) COMPOSITE PHOTOSENSITIVE ELEMENT

(75) Inventor: Martin John Hill, Sayre, PA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 09/415,971

(22) Filed: Oct. 12, 1999

(51) Int. Cl.[7] .................................... G03C 3/02
(52) U.S. Cl. ........................ 430/273.1; 430/270.1; 430/320; 430/501
(58) Field of Search ................. 430/273.1, 270.1, 430/281.1, 286.1, 300, 302, 320, 501

(56) References Cited

U.S. PATENT DOCUMENTS

| | | | |
|---|---|---|---|
| 4,293,635 | 10/1981 | Flint et al. | 430/271 |
| 4,378,264 | 3/1983 | Pilette et al. | 156/238 |
| 4,460,427 | * 7/1984 | Haney et al. | 156/303 |
| 5,213,945 | * 5/1993 | Roos et al. | 430/270.1 |
| 5,268,256 | 12/1993 | Goetz et al. | 430/284 |
| 5,326,674 | * 7/1994 | Toyama et al. | 430/325 |
| 5,595,859 | 1/1997 | OLson et al. | 430/325 |
| 5,674,660 | 10/1997 | Olson et al. | 430/284.1 |
| 5,888,701 | * 3/1999 | Fan | 430/306 |
| 6,057,079 | * 5/2000 | Shelnut | 430/272.1 |
| 6,100,006 | * 8/2000 | Taylor, Jr. et al. | 430/258 |

* cited by examiner

*Primary Examiner*—Janet Baxter
*Assistant Examiner*—Yvette M. Clarke

(57) ABSTRACT

A composite photosensitive element, adapted for storage in roll form without the use of a coversheet, and a method for making the same is provided. The photosensitive element has utility for the application of imagable photosensitive layers often used as acid resists and dielectrics. The photosensitive element comprises a base support having a backside and a coating side. The coating side has, in order, (1) a first photosensitive layer and (2) a non-tacky outer layer. The slip force between the backside of the base support and (2) the non-tacky outer layer is less than a predetermined quantity. This permits entrained air to escape when the photosensitive element is wound in roll form and maintains the integrity of the thickness of (1) the first photosensitive layer.

17 Claims, No Drawings

COMPOSITE PHOTOSENSITIVE ELEMENT

BACKGROUND OF THE INVENTION

1. Field of the Invention

This invention relates to a composite photosensitive element. It particularly relates to a photosensitive element which can be stored in roll form without the need for a coversheet and is useful as a photoresist.

2. Description of the Related Art

Photosensitive compositions are well known and are useful as photoresists in the formation of printed circuits, in the formation of lithographic printing plates, and in proofing applications. In such systems, actinic radiation impinges on a material containing at least one photoactive component to induce a physical or chemical change in that material. The latent image thereby produced can then be processed to form a patterned mask or an image. The photosensitive systems can be positive-working or negative-working. In positive-working systems, the areas exposed to actinic radiation are removed in the post-exposure processing step; in negative-working systems, the areas not exposed to actinic radiation are removed. Particularly useful compositions are negative-working photopolymerizable and/or photocrosslinkable compositions, hereinafter referred to collectively as "photopolymerizable". In such systems, exposure to actinic radiation initiates polymerization and/or crosslinking reactions, resulting in insolubilization of the material in suitable developer solutions. The latent image is developed by treating with the developer solution. The photopolymerizable compositions generally contain a binder, at least one monomeric or oligomeric material capable of polymerizing and/or cross-linking, and a photoinitiator.

The photopolymerizable compositions are generally formed as a continuous dry film on a base support. The dry film is generally sandwiched between the base support film and a coversheet and stored in roll form. As the roll is formed, a boundary layer of air is wound with the film between the laps. The surfaces of the base and coversheet are generally roughened to allow the air layer to bleed out the sides of the roll, resulting in smooth rolls.

When using the photosensitive film, it is conventionally unwound from the roll, the coversheet is removed, and the film is laminated to a substrate using a hot roll or vacuum laminator for subsequent exposure, development, etching and/or plating. Thus the coversheet is only used for protecting the film during storage and results in added cost. It would be desirable to eliminate the coversheet. However, the photosensitive compositions are frequently somewhat tacky and thus, in the roll, stick to the backside of the next lap immediately on contact. Flint et al., U.S. Pat. No. 4,293,635, disclose a photopolymerizable composition including an amphoteric interpolymer which can be stored in roll form without a coversheet, with a base support treated with a release layer on the backside to prevent the sticking of one layer to another. However, while the backside release layer facilitates unwinding of the roll without sticking, it does not allow the trapped air to bleed out. The pressure between laps of the roll and small differences in coating thickness tend to concentrate the air in large bubbles, which cause depressions in the resist layer, in turn causing defects in the circuit board. Thus it would be desirable to have a photosensitive element that could be stored in roll form without a coversheet without air entrapment between the layers of the roll.

SUMMARY OF THE INVENTION

This invention is directed to a composite photosensitive element suitable for use as a photoresist, which can be stored in roll form without a coversheet. The composite photosensitive element comprises a base support having a backside and a coating side, and comprising on the coating side, in order:

(1) a first photosensitive layer having a first photosensitive layer thickness; and (2) a non-tacky outer layer having a thickness no greater than one-fifth of the first photosensitive layer thickness, wherein the element can be stored in roll form without the presence of a coversheet, and further wherein the non-tacky outer layer and the backside of the base support exhibit a slip force between them of about 200 g or less.

In one embodiment of the invention, the non-tacky outer layer is a layer of non-tacky material that is applied to the photosensitive layer.

In another embodiment of the invention, the non-tacky outer layer is formed by exposure of the photosensitive layer to actinic radiation to form a thin layer of non-tacky exposed material on the photosensitive layer.

In another embodiment of the invention, the non-tacky outer layer is formed by exposure of the photosensitive layer to plasma to form a thin layer of non-tacky exposed material on the photosensitive layer.

In another embodiment of the invention, the non-tacky layer is formed by the addition of at least one incompatible ingredient to the photosensitive layer which migrates to the surface forming a non-tacky layer.

DETAILED DESCRIPTION OF THE PREFERRED EMBODIMENTS

The present invention provides a photosensitive element which can be stored in roll form without the need of a coversheet. The element has a base support, a photosensitive layer and a thin, non-tacky outer layer on the outer surface of the photosensitive layer.

It has been found by the present inventor that application of materials such as release layers which allow a roll to be unwound without sticking, is not sufficient to prevent air entrapment in the wound roll. Release materials coated on the backside of the base allow adjacent layers to be peeled apart, however, the tacky photosensitive layer, also known as a resist layer, is still adhered enough to the release layer that the entrapped air bubbles cannot move, even though they are under pressure from the winding tension applied when the roll is wound. Because the bubbles are under pressure they deform the resist layer with time, creating thin spots which cause circuit defects when the resist is used by the printed circuit manufacturer.

What is needed to allow entrapped air to bleed out is a low force for side to side slippage, that is, for the two layers to move relative to each other. This allows the layer of air between laps to migrate to the edges of the roll, and out from between the laps. It is preferred that the slip force between the non-tacky outer layer and the backside of the base support be about 200 g or less, more preferably less than 150 g. As used herein, the term "slip force" shall mean the force measured according to the procedure of ASTM Test Method D1894-90, modified such that the surface to be tested is placed on the sled of the test equipment and the base support is placed on the horizontal plane of the coefficient of friction fixture in such a way that the non-tacky outer layer will contact the backside of the base support. It is required that the sled move smoothly over the surface of the base support. In the case where the sled sticks to and/or skips across the base support, the result is considered a failure, and the results are considered to be above 200 g. As used herein, when stating "slip force between the non-tacky outer layer and the backside of the base support" it is meant that either (i) the non-tacky outer layer is in direct contact with the base support material, or (ii) the non-tacky outer layer is in contact with any layer or layers(s) disposed on the backside of the base support. Examples of such layers include release layers, antihalation layers, antistatic layers and the like.

The base support for the element can be any dimensionally stable film. Such support films are well known in the art and include polyesters, polyamides, polyolefins, polyimides, vinyl polymers, cellulose esters, and other relatively high molecular weight polymeric materials. A preferred base support for the present invention is polyethylene terephthalate. It is also possible to have a release coating on the backside of the base support, that is the side which does not have the photosensitive layer, in combination with the non-tacky layer of this invention. When the element is wound into a roll, the release coating helps to prevent the element of one layer from adhering too strongly to the backside of the adjacent layer. This facilitates the unwinding of the roll when the element is readied for use. Release materials are well-known in the art and include polysilicones, vinyl alcohol polymers, substituted polyacrylamides, fluorocarbons, and selected surfactants.

The photosensitive layer comprises at least one photoactive compound which, when exposed to actinic radiation, generates a species which causes a change in the physical and/or chemical properties of the photosensitive layer. Positive-working systems are well known and include systems based on o-quinone diazides which become soluble in a developer solution, such as aqueous alkaline solution, upon exposure to light; and polymeric systems which are degraded by photo-generated acids. Negative-working systems are also well known and generally include a photoinitiator or photoinitiator system (hereinafter referred to collectively as "photoinitiator system"), and at least one compound which reacts with the species generated by exposure of the photoinitiator to actinic radiation, causing a decrease in solubility of the photosensitive layer in a developer solution. A preferred system is a photopolymerizable system, comprising the photoinitiator system, an ethylenically-unsaturated compound, and a binder. Although not limited to negative-working photopolymerizable systems, the photosensitive layer of the element of the invention will be further described in terms of such systems.

The photoinitiator system has one or more compounds that directly furnish free radicals when activated by actinic radiation. The system also may contain a sensitizer that is activated by the actinic radiation, causing the compound to furnish the free radicals. Useful photoinitiator systems can also contain a sensitizer that extends spectal response into the near ultraviolet, visible, and near infrared spectral regions.

Photoinitiator systems are well known and discussions of such systems can be found in, for example, "Photoreactive Polymers: The Science and Technology of Resists" by A. Reiser, John Wiley & Sons, New York, 1989, and "Radiation Curing: Science and Technology" edited by S. P. Pappas, Plenum Press, New York, 1992.

Preferred photoinitiator systems are free radical generating addition polymerization initators activatable by actinic light and thermally inactive at and below 100° C. These include the substituted or unsubstituted polynuclear quinones such as 9,10-antbroquinone; vicinal ketaldonyl alcohols, such as benzoin; α-hydrocarbon-substituted aromatic acyloins, including α-methylbenzoin; Michler's ketone, benzophenone, hexaarylbiimidazoles in association with hydrogen donors. Particularly preferred photoinitiators include hexaarylbiimidazoles with hydrogen donors; Michler's ketone and ethyl Michler's ketone, particularly in association with benzophenone; and acetophenone derivatives.

The ethylenically-unsaturated compound is one which is capable of undergoing free-radical initiated polymerization and/or crosslinking. Such compounds are generally known as monomers or oligomers, although polymers having reactive pendant groups can also be used. Such compounds are well known in the art and have been disclosed in, for example, "Light-Sensitive Systems: Chemistry and Application of Nonsilver Halide Photographic Processes" by J. Kosar (John Wiley & Sons, Inc., 1965); "Imaging Processes and Materials —Neblette's Eighth Edition" edited by J. Sturge, V. Walworth and A. Shepp (Van Nostrand Reinhold, 1989); and "Photoreactive Polymer—The Science and Technology of Resists" by A. Reiser (John Wiley & Sons, 1989). Typical monomers are: unsaturated esters of alcohols, preferably esters of polyols with acrylic or methacrylic acid, such as t-butyl acrylate, cyclohexyl acrylate, hydroxy-C1–C10-alkyl acrylate, butanediol diacrylate, hexamethylene glycol diacrylate, trimethylolpropane triacrylate, polyoxyethylated trimethylopropane triacrylate, diethylene glycol diacrylate, glycerol triacrylate, ethylene glycol dimethacrylate, pentaaerythritol tri- and tetraacrylate and methacrylate; acryloxy- and methacryloxy-alkyl ethers of bisphenol A, such as di-(3-acryloxy-2-hydroxypropyl)ether of bisphenol A and di-(3-acryloxy-2-hydroxypropyl)ether of tetrabromo-bisphenol A; unsaturated amides, such as 1,6-hexamethylene bis-acrylamide; vinyl esters, such as divinyl succinate, divinyl phthalate, and divinyl benzene-1,3-disulfonate; styrene and derivatives thereof; and N-vinyl compounds, such as N-vinyl carbazole.

The binder is a film forming material which may contain reactive groups. Suitable binders that can be used alone or in combination are well known in the art. These include polyacrylate and alpha-alkyl acrylate esters; polyvinyl esters; ethylene vinyl acetate copolymers; polystyrene polymers and copolymers; vinylidene chloride copolymers; polyvinyl chloride and copolymers; synthetic rubbers; high molecular weight polyethylenhe oxides of polyglycols; epoxides; copolyesters; polyamides; polycarbonates; polyvinyl acetals; polyformaldehydes. Recently there has been more and more interest in binders which are aqueous processable. For aqueous processability, the binders should be developable by aqueous alkaline solution. By "developable" is meant that the binders are soluble, swellable or dispersible in the developer solution. Preferably, the binder is soluble in the developer solution. Particularly preferred as binders are acidic, polymeric, organic compounds. Single or multiple binder compounds can be used. One class of binders which is useful in the process of the invention is vinyl addition polymers containing free carboxylic acid groups. These are prepared from 30–94 mole percent of one or more alkyl acrylates and 70–6 mole percent of one or more alpha-beta ethylenically unsaturated carboxylic acids; more preferably from 61–94 mole percent of two alkyl acrylates and 39–6 mole percent of an alpha-beta ethylenically unsaturated carboxylic acid. Suitable alkyl acrylates for use in preparing these polymeric binders include methyl acrylate, ethyl acrylate, propyl acrylate, butyl acrylate, and the methacrylate analogs. Suitable alpha-beta ethylenically unsaturated carboxylic acids include acrylic acid, methacrylic acid, crotonic acid, maleic acid or maleic anhydride, and the like. Binders of this type, including their preparation, are described in German Application, OS 2,320,849, published Nov. 8, 1973. Styrene can be substituted for one of the alkyl acrylate or methacrylate components. Also suitable are copolymers of styrene and substituted styrenes with an unsaturated carboxyl-containing monomer, as described in detail in British Patent 1,361,298.

Other components conventionally added to photopolymerizable compositions can be present to modify the physical properties of the layer. Such components include: plasticizers, thermal stabilizers, optical brighteners, ultraviolet radiation absorbing material, color formers, adhesion modifiers, coating aids, and release agents. In addition, depending on the application, other inert additives can be employed such as dyes, pigments and fillers. These additives are generally present in minor amounts so as not to interfere with the exposure of the photoresist.

Typical compositions for the photopolymerizable layer are, by weight, based on the total weight of the photopolymerizable layer: photoinitiator system, 0.1 to 10%, preferably 1 to 7%; ethylenically unsaturated compound(s), 5 to 60%, preferably 15 to 50%; binder(s), 25 to 90%, preferably 45 to 75%; all other components, 0 to 5%, preferably 0 to 4%. The thickness of the layer varies according to the end use. Generally, the thickness is in the range of 0.3–5 mils (7–127 microns).

The non-tacky outer layer is the outermost layer from the base support. It is present to prevent air entrapment when the element is stored in roll form. If the non-tacky outer layer is too thin, it will not be able to prevent air entrapment by the tacky photosensitive layer. If the non-tacky outer layer is too thick, the photosensitive properties of the element will be adversely affected, for example, development time, development residue, and resolution. It is has been found that an acceptable non-tacky outer layer should have a thickness no greater than one-fifth of the thickness of the photosensitive layer. The non-tacky layer is generally less than 1 mil (25 microns) thick.

In one embodiment of the invention, the non-tacky outer layer comprises a non-tacky polymeric layer that has a composition different from the photosensitive layer. The layer can be made of almost any material that can be applied as a layer on the photosensitive layer and is not tacky and does not adversely affect the function of the photosensitive layer. In most cases the layer will comprise a polymeric material, with or without the other components of the photosensitive layer, such as monomers, initiators, surface modifiers, etc. Examples of suitable polymeric materials include polyamides, polyesters, acrylic polymers and copolymers, polymers and copolymers of acrylamide and substituted acrylamides, polymers and copolymers of polycaprolactone, polyvinyl acetate polymers and copolymers, and others. The non-tacky outer layer can be insoluble in the developer solution used with the photosensitive layer. Because of the thinness of the layer, it will be removed with the more soluble portion of the photosensitive layer in the development step, and remain with the insoluble portion. Alternatively, the non-tacky outer layer can be soluble in the developer solution so that the entire outer layer is removed in the development step. It is also possible for the non-tacky outer layer to be fully photosensitive and imageable.

The non-tacky outer layer can be applied to the photosensitive layer by any known application process. The non-tacky outer layer can be coated onto the photosensitive layer on the base support. The non-tacky outer layer can be applied with the photosensitive layer to the base support using a dual-coating or coextrusion process. Alternatively, the non-tacky outer layer can be applied to a temporary support and laminated to the photosensitive layer on the element base support. The temporary support would then be removed from the outer layer.

In another embodiment of the invention, the non-tacky outer layer is a thin layer of photopolymerizable material that has been exposed to actinic radiation. It can have the same composition (prior to exposure) as the photosensitive layer or a different composition. It is preferred, that it have the same composition. The non-tacky outer layer can be prepared by applying a very thin second photosensitive layer on a temporary support, exposing it to actinic radiation and then applying it to the first photosensitive layer, generally by lamination. However, the outer layer is most conveniently prepared by simply exposing the first photosensitive layer for a short period of time and/or low intensity to result in a very thin, non-tacky polymerized and/or crosslinked surface layer over the bulk of the photosensitive layer which remains photosensitive. The exposure dose will generally be less than the normal exposure for forming a developable resist or image, for example, one half or less of the imaging exposure. The depth of the exposed outer layer can further be controlled by the addition of a light absorbing compound to the first photosensitive layer. Examples of suitable light absorbing compounds include additional photoinitiators such as ethyl Michler's ketone, or unreactive compounds known to absorb preferentially at the wavelength of exposure. For example, acetophenone and decanophenone absorb strongly at 250 nm wavelength, and would limit the penetration of 250 nm light used for the overall exposure, while not absorbing appreciably at 360 (the wavelength usually used for imaging dry film resists), thus not affecting the imaging properties of the film.

In another embodiment of the invention, the non-tacky outer layer is a thin surface layer of the first photosensitive layer which has been given a surface treatment with either plasma or electrical discharge. Both types of surface treatments are well known. Plasma treatment generally involves treatment with activated or excited species of inert and/or active gases. Such species are usually produced in a microwave or RF discharge. For electrical treatment, electrical arcs and sparks are utilized. Discharges result from electrical breakdown of an air gap and they may be ac or dc. One common type is called a corona discharge. Either type of surface treatment causes tack reduction by oxidation, polymerization and/or crosslinking at the surface of the photosensitive layer.

In another embodiment of the invention, the non-tacky outer layer is a thin surface layer of the first photosensitive layer which contains an additional component which is incompatible with the at least one of the components of the photosensitive layer. In general, the additional component is incompatible with at least the binder of the photosensitive layer. By incompatible is meant that this component blooms to the surface of the coating and forms a layer whose properties such as tack are largely influenced by the incompatible component rather than the components of the bulk photosensitive layer. For acrylic-type binder systems, examples of incompatible polymers include acrylamide copolymers, cellulose derivatives such as ethyl cellulose, polyesters and fluorinated polymers. The surface layer can be prepared by applying it as a separate layer over the first photosensitive layer. Generally, however, it is prepared by adding the incompatible component to the first photosensitive layer when it is prepared. The incompatible component migrates to the surface of the photosensitive layer forming a thin surface coating.

A preferred non-tacky outer layer is one which includes a binder selected from polymers or copolymers of acrylamide or substituted acrylamide, and polymers or copolymers of caprolactone.

The photosensitive element of the invention is formed as described above and then wound into a roll for storage.

EXAMPLES

The invention is illustrated by the following examples which are not intended to be limiting. All percentages are by weight, unless otherwise indicated.

| Abbreviation | Glossary<br>Chemical Name |
|---|---|
| BP | Benzophenone |
| DBC | 2,3-dibromo-3-phenylpropiophenone |
| DEHA | N,N-diethylhydroxylamine |
| BMK | ethyl Michler's ketone |
| LCV | leuco crystal violet |
| Monomer A | Dimethacrylate ester of polyethoxylated Bisphenol A |
| NPG | N-phenyl glycine |
| o-Cl HABI | 2,2'-bis(2-chlorophenyl)-4,4',5,5'-tetraphenyl-1,2'-biimidazole |
| PGDMA | Propylene glycol 400 dimethacrylate |
| P-3 1R | 31/1 Block copolymer of propylene oxide and ethylene oxide |
| Polymer Binder B | Copolymer of methacrylic acid (21%), methyl methacrylate (35%), ethyl acrylate (19%), and butyl methacrylate (25%) |
| Polymer Binder C | Copolymer of butyl methacrylate (50%), t-octylacrylamide (30%) and acrylic acid (20%) |
| Polymer Binder D | Copolymer of butyl methacrylate (60%), t-octylacrylamide (20%) and acrylic acid (20%) |
| Polymer Binder B | Copolymer of butyl methacrylate (65%), t-octylacrylamide (15%) and acrylic acid (20%) |
| Polymer Binder F | Copolymer of methyl methacrylate (36%), butyl acrylate (16%), butyl methacrylate (25%) and methacrylic acid (23%). |
| SLS | Sodium lauryl sulfate surfactant |
| TCDM HABI | 2,2',5-tris-(o-chlorophenyl)-4-(3,4-dimethoxyphenyl)-4',5'-diphenyl-biimidazole |
| TMPEOTA | Ethoxylated trimethylolpropane triacrylate |
| TMPTMA | Trimethylolpropane trimethacrylate |
| TRPGDA | Tripropylene glycol diacrylate |
| ZONYL | Zonyl ® FSJ surfactant, made by DuPont Specialty Chemicals, 1007 Market Street, Wilmington, DE 19898 |

All films were prepared by dissolving or dispersing the components in the solvent indicated and coating onto the base support film indicated. The coatings were air dried.

Slip Force

The slip force was measured according to the procedure of ASTM Test Method D1894-90, modified to test the slip force between two different materials. The composite film to be tested was placed on the sled of the apparatus. The base support was placed on the horizontal plane of an Instron® Model 2810-005 coefficient of friction fixture, on an Instron® Model 4301 Tester. The composite film and the base support were positioned so that the outer layer of the composite film would contact the backside of the base support. In the test, the sled was pulled across the base support at a speed of 20 inches per minute. In some cases the sled did not move smoothly across the base support and stuck or skipped. In such cases the data generated by the Instron® instrument were not technically meaningful. Such tests were considered failures, with a slip force of greater than 200 g.

EXAMPLE 1

This example illustrates a composite photosensitive element having a thin, non-tacky outer layer having a composition different from that of the photosensitive layer.

A 1.5-mil thick first photosensitive layer having the formulation below was made on a conventional pilot scale coater from the solution listed onto 0.75 mil (19 micron) polyester as a base support with a polyethylene coversheet.

| Component | Concentration, % |
|---|---|
| Acetone | 41.6 |
| Methanol | 10.4 |
| Polymer Binder B | 30.3 |
| TMPEOTA | 12.0 |
| TRPGDA | 2.4 |
| DEHA | 0.024 |
| o-Cl HABI | 0.96 |
| Benzophenone | 1.92 |
| EMK | 0.096 |
| DBC | 0.012 |
| LCV | 0.24 |
| Victoria Blue Dye | 0.012 |

A thin non-tacky layer was prepared by coating a non-tacky polymer, Polymer Binder C, from a 10% solids solution in acetone onto 0.48 mil (11.4 micron) polyester. The dried coating had a coating weight of 20 mg/dm$^2$, or a thickness of about 2 microns. The polyethylene was removed from the photosensitive layer, and the photosensitive layer was then laminated to the Polymer Binder C coating. The 0.48 mil (11.4 micron) polyester film was then removed from the other side of the Polymer Binder C coating.

The slip force was determined for two samples of the coating, as detailed above. The slip force measured between the non-tacky outer layer (Polymer Binder C layer) of the composite element vs. polyester was 93 g in one case and 104 g in the other. The slip force of polyester vs. itself was measured at 80–90 g. Thus the slip of the composite element without a coversheet was similar to that of polyester.

The composite element was mounted on a slitter, and slit to customer size rolls which were 24.75 or 16 inches (62.9 or 40.6 cm) wide and 500 feet (15.2 m) long. A range of line speeds from 40 to 400 feet/minute (1.2 to 12.2 m/minute) and layon roll pressures from 0.5 to 2.2 pli (89.3 to 393 g/cm) was tested. All the composite rolls had good roll formation without air entrapment. A control roll made with a conventional photoresist structure (polyester/photoresist coating/polyethylene) was slit under the same range of conditions, while peeling the polyethylene layer, so that the photoresist coating contacted the polyester of the next lap. Air entrapment was present in all the slit control rolls.

The composite element was laminated to scrubbed 7 inch by 9 inch (17.8 cm by 22.9 cm) copper laminate with the Polymer Binder C layer next to the copper. This was imagewise exposed with 30 to 60 mJ/cm$^2$ on a DuPont PC-530 exposure unit (E. I. du Pont de Nemours and Company, Wilmington, Del.). The exposed film was developed using a 1.0% sodium carbonate aqueous solution at 85° C. At the standard 105° C. lamination temperature, the adhesion to copper was lower than desired, so that the finest lines (e.g., 60–90 micron wide lines and spaces) were washed off in development. However, at 120° C. lamination temperature, the element adhered well and had as good resolution as the control (single layer) commercial photoresist, holding lines down to 60 microns wide.

EXAMPLE 2

This example illustrates a composite photosensitive element having a thin non-tacky outer layer formed from the first photosensitive layer.

Samples were used of a commercial photoresist, Riston® APFX (E. I. du Pont de Nemours and Company, Wilmington, Del.) which comprised a photosensitive layer between a polyester base support and a polyethylene coversheet. Samples about 2 feet (61 cm) long were exposed in the vacuum frame of a PC-530 exposure unit with the polyethylene side up for 0, 5, 10, 20, 50 and 100 mJ/cm$^2$. The polyethylene was peeled off and 5 slip angle measurements were taken for each exposure using an inclined plane slip tester with 27 gauge polyester on the inclined plane and the resist sample on the slider. The average angle at which the slider slides down the inclined plane for each exposure was found to decline with increasing exposure:

| Exposure, mJ/cm$^2$ | Slip angle, Degrees |
| --- | --- |
| 0 | 44.6 |
| 10 | 39.4 |
| 20 | 28.0 |
| 50 | 22.8 |
| 100 | 21.0 |

Thus exposure to about 50 mJ/cm$^2$ gives a slip angle about the same as polyester, which was approximately 22 degrees. Surprisingly, these exposed resists can still be laminated to copper and imaged. However, the exposure can lead to development residues when the degree of polymerization is too high to allow swelling and dispersion by the developer.

EXAMPLE 3

This example illustrates a composite photosensitive element having a non-tacky outer layer formed from the photosensitive layer, in which development residues have been minimized. To reduce the amount of development residues, the penetration of the overall exposure was decreased by adding a light absorber to the formulation, in this case ethyl Michler's Ketone:

| | Weight, g | | | |
| --- | --- | --- | --- | --- |
| Component | 3A | 3B | 3C | 3D |
| Acetone | 23.5 | 23.5 | 23.5 | 23.5 |
| Binder B solution (44.5% Solids in 85/15 Acetone/methanol) | 141.1 | 141.1 | 141.1 | 141.1 |
| TMPEOTA | 9.65 | 9.65 | 9.65 | 9.65 |
| TMPTMA | 4.15 | 4.15 | 4.15 | 4.15 |
| TRPDOA | 4.77 | 4.77 | 4.77 | 4.77 |
| DEHA | 0.050 | 0.050 | 0.050 | 0.050 |
| Victoria Blue | 0.025 | 0.025 | 0.025 | 0.025 |
| Benzophenone | 4.00 | 4.00 | 4.00 | 4.00 |
| LCV | 0.50 | 0.50 | 0.50 | 0.50 |
| DBC | 0.025 | 0.025 | 0.025 | 0.025 |
| TCDM HABI | 1.00 | 1.00 | 1.00 | 1.00 |
| NPO | 0.050 | 0.050 | 0.050 | 0.050 |
| Monomer A | 11.0 | 10.8 | 10.0 | 6.0 |
| EMK | 0.20 | 0.40 | 1.2 | 5.2 |

These formulations were coated at 1.2 mils (30.5 micron) thickness onto polyester base supports with a polyethylene coversheet. The elements were exposed through the polyethylene at 0, 10, 20, 30 mJ/cm$^2$. After removal of the polyethylene coversheet, the elements were then laminated with the exposed side to scrubbed copper. They were exposed through the polyester base support and artwork at 30 and 60 mJ/cm$^2$ (the normal exposure range) and developed at the normal development rate for the unexposed resist with 1.5% sodium carbonate aqueous solution at 85° C. The amount of residues after development were compared. It was found that the amount of residue was less with higher levels of EMK, and the overall exposure required to create residues was less with higher levels of EMK. Thus a high optical density photosensitive element can have a polymerized low tack surface and a window of operation without or with minimal levels of development residues.

| EMK | % of Board Covered | | | |
| --- | --- | --- | --- | --- |
| Concentration | 0 mJ/cm$^2$ | 10 mJ/cm$^2$ | 20 mJ/cm$^2$ | 30 mJ/cm$^2$ |
| 0.2 | 0 | 100 | 100 | 100 |
| 0.4 | 0 | 95 | 100 | 100 |
| 1.2 | 0 | 60 | 84 | 87 |
| 5.2 | 0 | 18 | 40 | 62 |

EXAMPLE 4

An alternate method of controlling the thickness of the exposed layer is to make a coating of known thickness, expose it, and then laminate it to an unexposed photosensitive layer. A solution similar to that listed above, with 0.10% EMK was coated at three coating weights (21, 12 and 7 mg/dm$^2$) which corresponded to thicknesses of approximately 2, 1, and 0.7 microns, respectively. After drying, these coatings were overall exposed at 0, 10, 20 and 30 mJ/cm$^2$, and then laminated to the photosensitive layer of samples of a commercial photoresist, Riston® APFX, which was 1.2 mils (30.5 microns) thick. The composite element was laminated to scrubbed copper, with the exposed non-tacky outer layer next to the copper. It was then exposed again at 30 to 60 mJ/cm$^2$ through the photoresist base support and a negative, and developed at a conveyor rate so that the APFX layer would develop off at 33% of the length of the development chamber ("33% breakpoint"). The thickness of the resist residue after development was measured:

| Coating Thickness | Residue Thickness, mil (microns) | | | |
|---|---|---|---|---|
| (mg/dm$^2$) | 0 mJ/cm$^2$ | 10 mJ/cm$^2$ | 20 mJ/cm$^2$ | 30 mJ/cm$^2$ |
| 7 | 0 | 0 | 0.12 (3) | 0.14 (3.6) |
| 12 | 0 | 0 | 0.14 (3.6) | 0.13 (3.3) |
| 21 | 0 | 0.1 (2.5) | 0.14 (3.6) | 0.16 (4.1) |

Once again, the presence of development residues decreased as the overall exposure and the thickness of the exposed layer decreased.

EXAMPLE 5

This example illustrates the formation of a non-tacky outer layer from an aqueous dispersion.

A dispersion of Polymer Binder C at 50% solids in water was made and included in the following composition:

| | |
|---|---|
| Deionized water | 62.9 g |
| Polymer Binder C Dispersion | 33.35 g |
| Polyethylene glycol mol wt. 8000 | 3.75 g |

A rod coating of this composition was made on 0.48-mil (12.2 micron) thick polyester film temporary support at 20 mg/dm$^2$ dry thickness. The rod coating was laminated to a sheet of Riston® AP730PC photoresist (E. I. du Pont de Nemours and Company, Wilmington, Del.) from which the polyethylene coversheet had been removed. The polyester film temporary support was removed, leaving the rod coating adhered to the Riston® film surface, forming a composite photosensitive element having an outer layer with low tack. The composite photosensitive element could be doubled over, the film surface pressed against itself, and easily pulled free. The commercial film control was tacky and clearly had a much higher force to separate the layers again. The composite photosensitive element was laminated to a scrubbed copper board, with the rod coating against the copper. The board was exposed at 40 mJ/cm$^2$ and developed as described in Example 1, with the following results:

| Film | Riston ® AP730PC Control | Composite Photosensitive Element |
|---|---|---|
| Development time, sec | 39 | 39 |
| Steps held | 31 | 30 |
| Line/space resolved (micron) | 60 | 75 |

Thus the composite photosensitive element of the invention with the low-tack outer layer can be imaged with similar results to a commercial resist control

EXAMPLE 6

This example illustrates a composite photosensitive element having a photosensitive non-tacky outer layer.

The following photosensitive compositions were prepared with 50% solids, the amounts in grams:

| | Sample | | | |
|---|---|---|---|---|
| Component | 6A | 6B | 6C | 6D |
| Polymer C Dispersion* | 20 | — | — | 20 |
| Polymer D Dispersion* | — | 20 | — | — |
| Polymer B Dispersion* | — | — | 20 | — |
| TMPEOTA | 2.98 | 2.98 | 2.98 | 2.98 |
| BP | 0.50 | 0.50 | 0.50 | 0.50 |
| EMK | 0.02 | 0.02 | 0.02 | 0.02 |
| c-C1 HABI (5% solution in acetone) | — | — | — | 7.7 |
| Water | 90 | 90 | 90 | 90 |

The compositions were coated onto temporary support films and laminated to Riston® AP730PC photoresist sheets as described in Example 5. The films were tested for photosensitivity with the following results:

| | Riston ® AP730PC | Test Coatings | | | |
|---|---|---|---|---|---|
| Film | Control | 6A | 6B | 6C | 6D |
| Development time, sec (1% aqueous sodium carbonate) | 16 | 16 | 18 | 18 | 18 |
| Steps held (30 mJ/cm$^2$ exposure) | 27 | 25 | 25 | 25 | 25 |
| Line/space resolved (micron) | 60 | 70 | 80 | 80 | 80 |

EXAMPLE 7

This example illustrates that the non-tacky outer layer compositions can be scaled up to a pilot scale coater, and the film made into standard product rolls.

The following compositions were made, weight in grams:

| Component | Sample 7A | Sample 7B |
|---|---|---|
| Deionized water | 81614 | 81614 |
| Polymer C Dispersion | 18144 | 18144 |
| TMPEOTA | 1927.4 | 1927.4 |
| BP | 317.4 | 317.4 |
| EMK | 23.2 | 23.2 |
| ZONYL | 408 | — |
| SLS | — | 268 |

Rolls of Riston® AP730PC photoresist film were used as the coating substrate. The polyethylene coversheet was removed, and the above compositions were coated onto the Riston® photopolymer layer and dried, so that the low-tack layer coating weight was 20 mg/dm$^2$ (i.e., approximately 2 microns thick). The resulting rolls were slit on a commercial slitter to rolls of 500 feet (15.2 m) long and 20 inches (50.8 cm) wide. The roll formation was good for both compositions 7A and 7B, with no air entrapment visible between laps.

COMPARATIVE EXAMPLE 1

The photosensitive composition below was coated onto a polyester film base support to a thickness of 1.5 mils (38 microns) in a pilot coater. The photosensitive layer was dried and laminated to a polyethylene coversheet.

| Component | Concentration, parts per hundred of Polymer Binder F |
| --- | --- |
| Acetone | 53.4 |
| Isopropanol | 87.1 |
| Polymer Binder F | 100.0 |
| TMPEOTA | 23.0 |
| PGDMA | 22.2 |
| P31R1 | 7.3 |
| EMK | 0.24 |
| BP | 3.2 |
| LCV | 0.55 |
| DEHA | 0.030 |
| NPG | 0.078 |
| Victoria Green Dye | 0.093 |
| DBC | 0.40 |

The photosensitive film was finished to customer rolls 24¾ inches (62.9 cm) wide and 500 feet (152 m) long. As it was processed, the polyethylene film was removed, and the finished rolls were wound without a coversheet. The widest range of winding conditions available on a commercial slitter was used to attempt to eliminate air entrapment: 40 to 400 feet (12.2 to 122 meters) per minute line speed, and 1.1 to 2.2 pounds per linear inch (196 to 393 g/cm) layon roll pressure. The web tension was ⅓ pounds per linear inch (59.5 g/cm). As the line speed was reduced to 40 feet (12.2 m) per minute and the layon roll pressure was increased to 2.2 pounds per linear inch (393 g/cm), the incidence of air entrapment was reduced, but not eliminated. Air bubbles between the laps were visible even under these conditions. Since these extreme conditions are not commercially viable, requiring very low productivity in the slitter, and producing very hard rolls which will edge fuse, it was concluded that the photopolymer composition was too tacky to be wound without a coversheet.

The slip force of a sample of this photosensitive film vs. the backside of the polyester base support was measured as described above and found to be 307 gm. The slip force between a typical commercial photoresist, Riston® AP730PC, and polyester was determined to be >500 g.

What is claimed is:

1. A composite photosensitive element comprising a base support having a backside and a coating side, and comprising on the coating side, in order:
   (1) a first photosensitive layer having a first photosensitive layer thickness; and
   (2) a non-tacky outer layer having a thickness no greater than one-fifth of the first photosensitive layer thickness, wherein the element can be stored in roll form without the presence of a coversheet, and further wherein the non-tacky outer layer and the backside of the base support exhibit a slip force between them of about 200 g or less.

2. The composite photosensitive element of claim 1 wherein the backside of the base support is coated with a release layer.

3. The composite photosensitive element of claim 1 wherein the first photosensitive layer comprises a photoinitiator system, an ethylenically-unsaturated compound, and a binder.

4. The composite photosensitive element of claim 1 wherein the non-tacky outer layer comprises a non-tacky polymeric layer different in composition from the first photosensitive layer.

5. The composite photosensitive element of claim 1 wherein the non-tacky outer layer comprises a photosensitive composition containing a compound which is incompatible with at least one component in the photosensitive composition.

6. The composite photosensitive element of claim 1 wherein the non-tacky outer layer comprises a binder selected from polymers of acrylamide, copolymers of acrylamide, polymers of substituted acrylamide, copolymers of substituted acrylamide, polymers of caprolactone, and copolymers of caprolactone.

7. The composite photosensitive element of claim 1 wherein the non-tacky outer layer comprises a layer of photopolymerizable material that has been exposed to actinic radiation.

8. The composite photosensitive element of claim 7 wherein the photopolymerizable material of the non-tacky outer layer has the same composition as the first photosensitive layer.

9. The composite photosensitive element of claim 7 wherein the photopolymerizable material of the non-tacky outer layer has the composition comprising the composition of the first photosensitive layer and a light absorber.

10. A process for forming a wound storage roll of a composite photosensitive element comprising:
   (a) forming a first photosensitive layer on a base support;
   (b) applying a non-tacky outer layer to form a composite element;
   (c) winding the composite element into a roll without the addition of a coversheet over the non-tacky outer layer.

11. The process of claim 10 wherein the first photosensitive layer and the non-tacky outer layer are applied to the base support at the same time, such that the outer layer is furthest removed from the base support.

12. The process of claim 10 wherein step (b) is carried out by lamination.

13. The process of claim 10 wherein the non-tacky outer layer comprises a polymeric layer different from the photosensitive layer.

14. The process of claim 10 wherein the non-tacky outer layer comprises a photosensitive layer which has been exposed to actinic radiation.

15. A process for forming a wound storage roll of a composite photosensitive element comprising:
   (a) forming a first photosensitive layer on a base support;
   (b) exposing the first photosensitive layer to actinic radiation such that a thin non-tacky outer layer is formed on the surface thereby forming a composite element;
   (c) winding the composite element into a roll without the addition of a coversheet over the non-tacky outer layer.

16. The process element of claim 15 wherein the first photosensitive layer comprises a photoinitiator system, an ethylenically-unsaturated compound, and a binder.

17. The process of claim 16 wherein the first photosensitive layer further comprises a light absorber.

* * * * *